United States Patent [19]

Adams et al.

[11] 4,401,953

[45] Aug. 30, 1983

[54] HIGH STABILITY AMPLIFIER

[75] Inventors: William A. Adams, College Park; Victor S. Reinhardt, Gaithersburg, both of Md.

[73] Assignee: The United States of America as represented by the Administrator of the National Aeronautics and Space Administration, Washington, D.C.

[21] Appl. No.: 284,290

[22] Filed: Jul. 17, 1981

[51] Int. Cl.³ .............................................. H03F 3/04
[52] U.S. Cl. .................................... 330/289; 330/310
[58] Field of Search ..................... 330/65, 66, 85, 289, 330/297, 310, 311

[56] References Cited

FOREIGN PATENT DOCUMENTS 568495  1/1959  Canada ............................... 330/289

Primary Examiner—James B. Mullins
Assistant Examiner—Gene Wan
Attorney, Agent, or Firm—John O. Tresansky; John R. Manning; Robert E. Bushnell

[57] ABSTRACT

An electrical RF signal amplifier for providing high temperature stability and RF isolation and comprised of an integrated circuit voltage regulator (26), a single transistor (22), and an integrated circuit operational amplifier (24) mounted on a circuit board (80) such that passive circuit elements (92) are located on side of the circuit board while the active circuit elements (22, 24, 26) are located on the other side. The active circuit elements are embedded in a common heat sink (70) so that a common temperature reference is provided for changes in ambient temperature. The single transistor (22) and operational amplifier (24) are connected together to form a feedback amplifier powered from the voltage regulator (26) with transistor (22) implementing primarily the desired signal gain while the operational amplifier (24) implements signal isolation. Further RF isolation is provided by the voltage regulator (26) which inhibits cross-talk from other like amplifiers powered from a common power supply. Input and output terminals consisting of coaxial connectors (44, 26) are located on the sides of a housing (69) in which all the circuit components and heat sink (80) are located.

16 Claims, 6 Drawing Figures

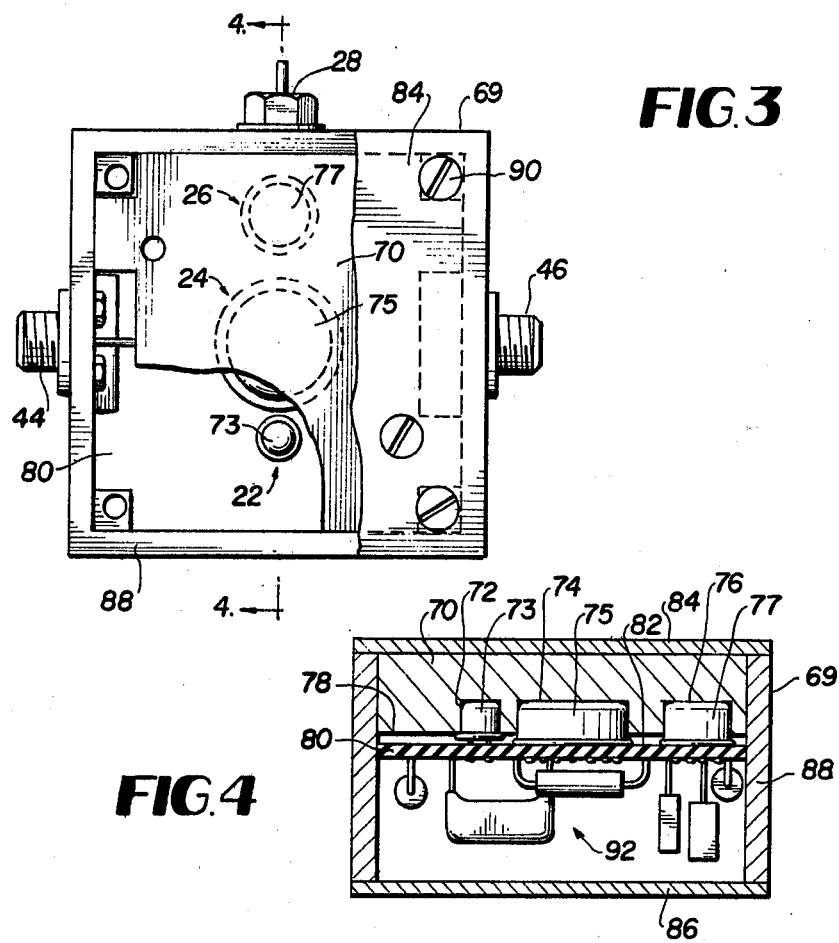
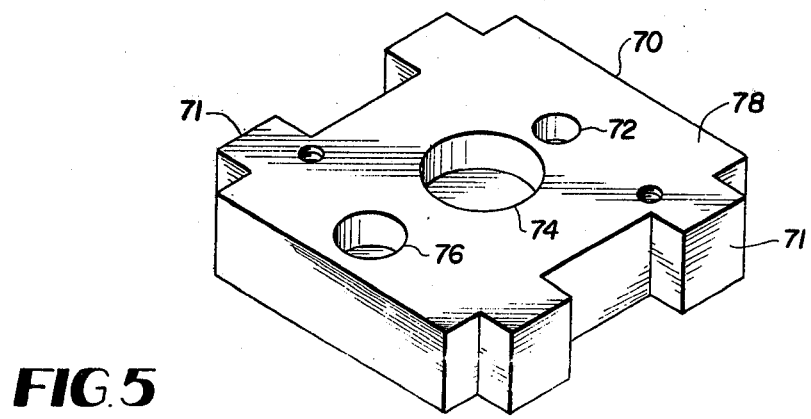

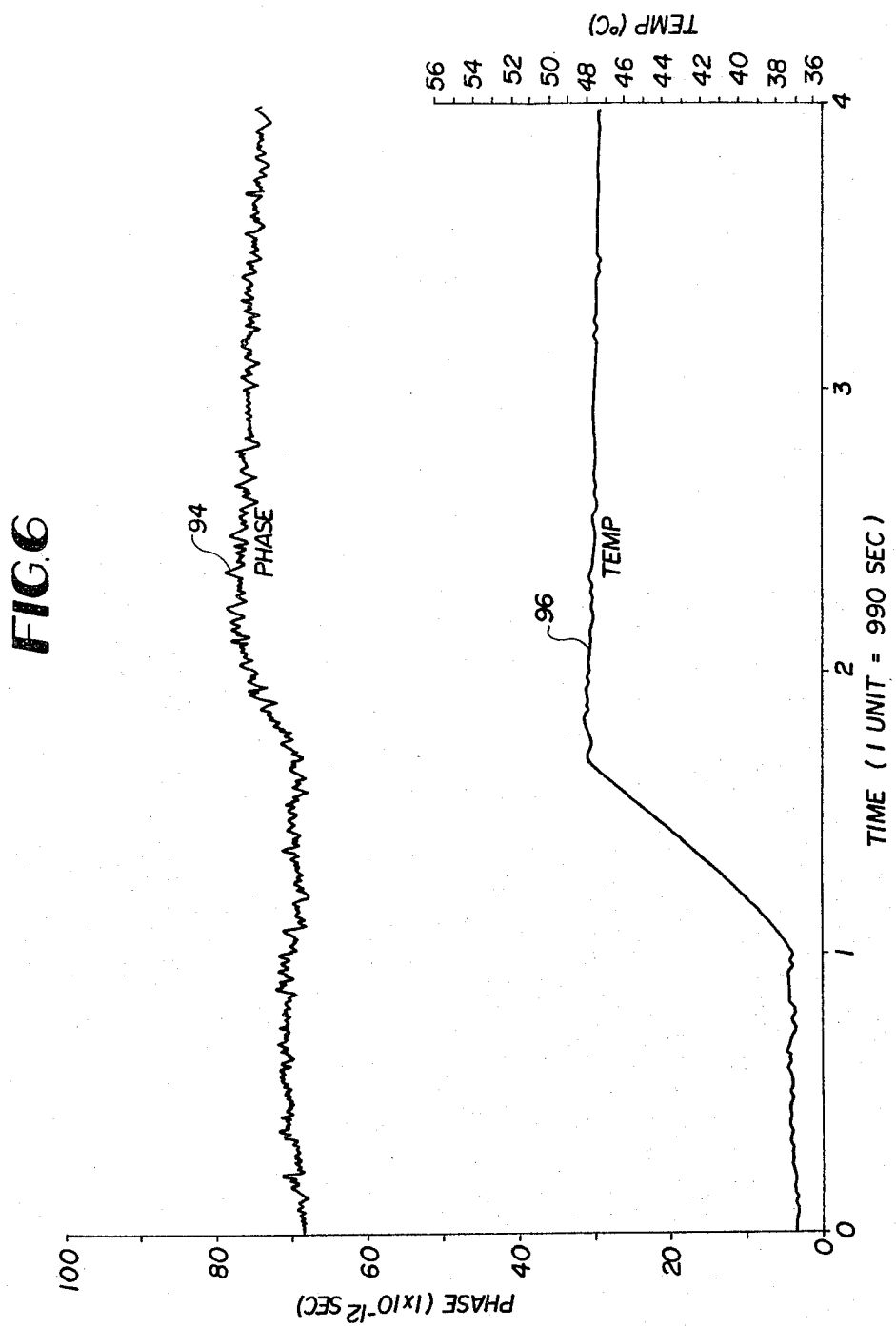

HIGH STABILITY AMPLIFIER

ORIGIN OF THIS INVENTION

The invention described herein was made by employees of the U.S. Government and may be manufactured and used by or for the Government for governmental purposes without payment of any royalties thereon or therefor.

CROSS REFERENCE TO RELATED APPLICATION

This application is related to an application for an invention entitled, "High Stability Buffered Phase Comparator," U.S. Ser. No. 06/284,314, filed in the names of the present inventors on July 17, 1981 and assigned to the assignee of this application.

TECHNICAL FIELD

The invention relates generally to electrical signal amplifiers and more particularly to radio frequency amplifiers which exhibit a relatively high stability with respect to ambient temperature changes.

BACKGROUND ART

In applications where it is required to distribute the output signal from a relatively high precision oscillator such as a hydrogen maser or other type atomic frequency standard, without degradation in phase stability, or to make a phase comparison between two or more of such frequency sources without disturbing one another, it is necessary to provide a relatively large amount of isolation therebetween. This is accomplished by means of suitable driver and buffer amplifiers. While known prior art apparatus operates to provide reasonably good isolation, their temperature stability and signal isolation has been found to be less than adequate where sub-picosecond frequency resolution is desired.

Accordingly, it is an object of the present invention to provide an improvement in wideband low noise electrical signal amplifiers which are operable at RF frequencies.

Another object of the invention is to provide an improvement in electrical signal amplifiers which exhibits a relatively high degree of output stability with respect to changes in ambient temperature.

Still another object of the invention is to provide an improvement in electrical signal amplifiers which provides a relatively high degree of isolation between input and output terminals.

STATEMENT OF INVENTION

These and other objects are provided in accordance with an electrical signal amplifier providing a predetermined gain and isolation between input and output terminals and comprised of feedback amplifier circuit means and supply voltage regulator circuit means for said amplifier means located in a common housing. Said feedback amplifier means and said voltage regulator means respectively include active circuit elements which are embedded in a common heat sink positioned in said housing. RF isolation is provided by both the amplifier circuit means and the voltage regulator circuit means.

The foregoing as well as other objects, features and advantages of the invention will become more apparent from the following detailed description when taken in conjunction with the drawings.

BRIEF DESCRIPTION OF DRAWINGS

FIG. 3 is a top plan view partially in section of a housing including the subject invention;

FIG. 4 is a cross sectional view of FIG. 3 taken along the lines 4—4 and being illustrative of the physical arrangement of the component parts of the invention contained therein;

FIG. 5 is a perspective view of the common heat sink which forms a portion of the preferred embodiment of the invention; and FIG. 6 is a graphical illustration of the output stability for a predetermined temperature change over a predetermined period of time.

DETAILED DESCRIPTION OF INVENTION

Figure 1:
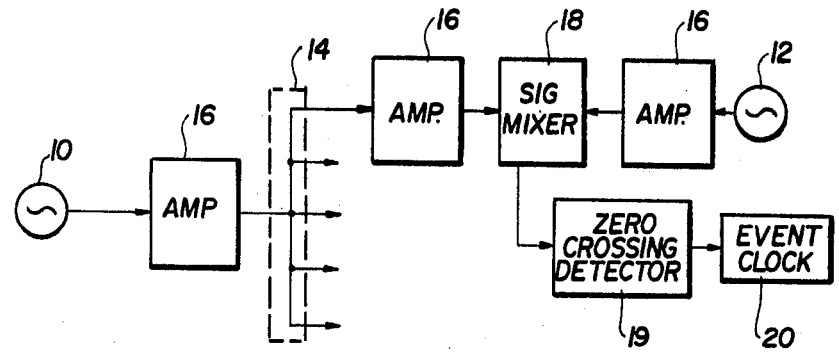
FIG. 1 is an electrical block diagram generally illustrative of the field of use of the subject invention.

Referring now to the drawings and more particularly to FIG. 1, there is disclosed a system for comparing the phase of two relatively high precision RF signal generators 10 and 12 whose frequencies are substantially the same in order to resolve any frequency difference therebetween. Typically the signal generators 10 and 12 are both comprised of hydrogen maser frequency standards which generate, for example, a 5 MHz signal and therefore a sub-picosecond ($1 \times 10^{-12}$ sec.) resolution is desired. Essential for proper operation of the system are buffer and driver amplifiers which act to isolate the sources 10 and 12 from one another. Also there is a need to protect the source 10, for example, from being affected by any other apparatus, not shown, coupled thereto via a power splitter 14.

Accordingly, as shown in FIG. 1, buffer amplifiers 16 are coupled not only between the frequency source 10 and the power splitter 14, but also between the power splitter 14 and a signal mixer 18 and between the mixer 18 and the other frequency source 12. In operation, the mixer 18 generates a beat frequency output which is applied to a low noise zero crossing detector circuit 19 which provides a square wave output having positive and negative going edges corresponding to the phase difference between two sources 10 and 12. By measuring the time interval between these edge crossings in an event clock 20, a very accurate measurement of frequency difference between the sources 10 and 12 can be obtained.

Because of the extremely stable output frequencies generated by atomic frequency standards such as the hydrogen masers 10 and 12, it becomes necessary that the peripheral circuitry coupled thereto, such as the amplifiers 16, not degrade the phase stability of these frequency sources and thus must exhibit a relatively high output stability particularly with respect to ambient temperature changes over a relatively long period of time.

Figure 2:
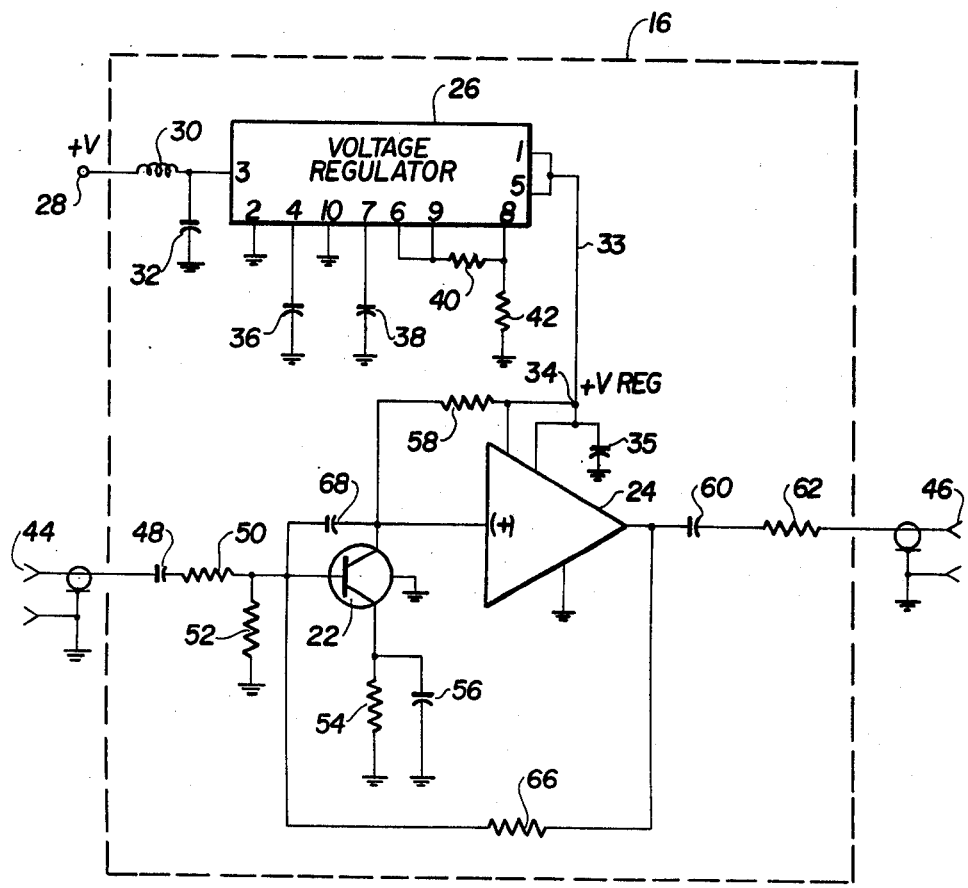
FIG. 2 is an electrical schematic diagram illustrative of the circuit details of the preferred embodiment of the invention.

Referring now to FIG. 2, each amplifier 16 includes three circuit components having active circuit elements which are temperature referenced to a common heat sink. The three circuit components include a single driver transistor 22 coupled in a feedback circuit arrangement to the non-inverting (+) input of an integrated circuit operational amplifier 24 and an integrated circuit voltage regulator 26. The voltage regulator 26 is adapted to provide both the transistor 22 and the operational amplifier 24 with a +V regulated power supply voltage from an unregulated power supply potential coupled to terminal 28. The voltage regulator 26 typically comprises a Motorola type MC1569G integrated circuit module which is adapted to receive the unregulated input voltage at pin 3 after being filtered by the combination of series connected inductor 30 and a capacitor 32 connected to a point of reference potential, commonly referred to and illustrated as ground. A regulated output voltage appearing on pins 1 and 5 which as shown in FIG. 2, is coupled to a circuit junction 34 which is adapted to supply both the transistor 22 and the operational amplifier 24 with a regulated power supply potential. The associated circuit elements including the capacitors 36 and 38 as well as the resistors 40 and 42 are coupled to the designated pins of the voltage regulator module 26 and operate to set the desired voltage output level on circuit lead 33. In addition to providing a regulated supply voltage to the transistor 22 and operational amplifier 24, the voltage regulator 26 also acts to increase RF isolation by inhibiting cross-talk from other like apparatus powered from a common power supply, not shown.

Directing attention more closely now to the single transistor 22 and the operational amplifier 24, transistor 22 operates as a signal gain device whereas the operational amplifier 24 operates as a unity gain buffer or isolation device between signal input means 44 and signal output means 46 both of which include coaxial connectors. The transistor 22 typically comprises a Motorola type 2N2857 N-P-N transistor while the unity gain buffer amplifier 24 comprises an integrated circuit module typically a National Semiconductor type LH0033 integrated circuit. The input signal applied to connector 44 is coupled to the base of transistor 22 by means of a coupling capacitor 48 and a resistive voltage divider consisting of resistors 50 and 52. The emitter of transistor 22 is coupled to ground by means of resistor 54 which is also shunted by the capacitor 56. A load resistor 58 is coupled between the collector of transistor 22 and the regulated supply voltage which appears at junction 34. The amplified output signal which appears at the collector of transistor 22 and is applied to the non-inverting input of operational amplifier 24, is fed through the amplifier to the output connector 46 via the capacitor 60 and the resistor 62. Both the single transistor 22 and the operational amplifier 24 operate in a signal feedback loop consisting of a fixed resistor 66 coupled from the output of the unity gain amplifier 24 back to the base of transistor 22. In addition a feedback capacitor 68 is also included between the collector and base of transistor 22. The signal gain into a 50 ohm characteristic impedance is controlled by the values of feedback resistor 66 and capacitor 68 and typically ranges between 1 and 10 depending on whether the circuit 16 is used as a driver amplifier or simply as a buffer.

The three components 22, 24 and 26 comprise or include active semiconductor devices and as such their operation is dependent on the surrounding or ambient temperature. In order to provide a high degree of operational stability for the type of application referred to in FIG. 1, a common heat sink is provided into which the housing for the components 22, 24 and 26 are embedded in order to not only slow down the effect of ambient temperature changes on the individual devices, but also to reduce temperature gradients therebetween to thereby improve the cancellation of temperature effects inherent in such devices.

The heat sink of the invention is shown in FIG. 5 and comprises a generally rectangular metal block 70 of substantial mass which is adapted to fit in a housing 69 as shown in FIGS. 3 and 4. The block 70, in addition to having four outer spacer regions 71, also includes three circular bores 72, 74 and 76 formed in one of its broad wall surfaces 78. The purpose of the bores is to receive the top portion or covers of the hermetically sealed packaging means 73, 75 and 77 containing the single transistor 22, the active devices of the operational amplifier 24 and the voltage regulator 26, as shown in FIGS. 3 and 4. As presently manufactured, these three components are packaged such that their top cover portions are comprised of metal type caps having a circular cross section. The circuit configuration shown in FIG. 2, moreover, is structured such that the passive circuit elements are mounted on one side of circuit assembly means comprising a printed circuit board 80 as shown in FIG. 4 while the three component elements 22, 24 and 26 including their respective active devices are mounted on the other side of the circuit board 78. Such an arrangement is necessary so that the passive elements will not obstruct the positioning of the heat sink 28. Accordingly, the side 82 of the circuit board 80 containing the active semiconductor elements are brought into face to face registration with the surface 78 of heat sink 70 and the top cover portions of the packages 73, 75 and 77 are embedded in the bores 72, 74 and 76 and held therein by an adhesive compound.

Further, as shown in FIGS. 3 and 4, the housing 69 comprises a closed metallic structure including top and bottom plates 84 and 86 which are attached to a rectangular body 88 by means of screws 90. The supply terminal 28 as well as the input and output connectors 44 and 46 are located in the side walls of the body 88. As shown in the cut away section of FIG. 4, the heat sink block 70 occupies substantially the upper half of the interior of the housing 69 with the circuit board 80 being located mid-way therein with the passive electrical components 92 occupying the other half of the interior of the housing.

The temperature stability of an RF amplifier configured in accordance with the invention can be observed such as shown in FIG. 6 by means of a phase comparison measurement made between two RF signals of the same frequency such as shown in FIG. 1. Where, for example, the phase difference between the two sources 10 and 12 coupled to the mixer 18 through one or more amplifiers 16 are measured by the event clock 20 and plotted as a function of time as exemplified by the graphical curve 94 and the ambient temperature is caused to change during the measurement time period as shown by graphical curve 96, it can be seen that the phase measurement changes only slightly, being on the order of 1 picosecond ($1 \times 10^{-12}$ sec.) per degree Celsius (°C.).

Having thus disclosed what is at present considered to be the preferred embodiment of the invention, it should be understood that the same has been provided by way of explanation and not of limitation. Accordingly, all modifications, alterations, changes coming within the spirit and scope of the invention as set forth in the appended claims are meant to be included.

We claim:

1. A low noise, wideband radio frequency signal amplifier for providing increased radio frequency isolation and signal stability for changes in ambient temperature between input and output circuit means comprising:
voltage regulator means (26) for regulating a power supply potential applied thereto and providing radio frequency isolation from cross-talk appearing at a source supplying said power supply potential, said regulator means including active circuit means and package means (77) for said active circuit means;
electrical signal amplifier means including first and second signal amplifiers (22, 24) connected in a feedback circuit configuration including at least one feedback circuit element (66) and wherein said first amplifier (22) comprises a gain producing circuit and said second amplifier (24) comprises a unit gain isolation circuit, each amplifier (22, 24) additionally having respective active circuit means and package means (73, 75) for said respective active circuit means;
said regulator means being coupled to said amplifier means (22, 24) for applying a regulated power supply potential thereto;
circuit means (48, 50, 52 and 60, 62) coupling said amplifier means (22, 24) between said input and output circuit means (44, 46); and
heat sink means (70) in common thermal contact with said package means (73, 75, 77) for providing a common temperature reference for said active circuit means.

2. The amplifier as defined by claim 1 and additionally including metal housing means (69) having located therein said voltage regulator means (26), said electrical signal amplifier means (22, 24) and said heat sink means (70) for providing a common enclosure which is subject to ambient temperature changes.

3. The amplifier as defined by claim 1 further comprising circuit assembly means (80) having said feedback circuit element and circuit means mounted on one side of said assembly means and said active circuit means mounted on the other side of said assembly means.

4. The amplifier as defined by claim 3 wherein said circuit assembly means (80) comprises a circuit board.

5. The amplifier as defined by claim 1 wherein said heat sink means (70) comprises a relatively thick block of heat conductive material having a mass relatively greater than that of said package means (73, 75, 77).

6. The amplifier as defined by claim 5 wherein said heat conductive material of said heat sink means (70) contains a plurality of recesses (72, 74, 76) for receiving said package means (73, 75, 77).

7. The amplifier as defined by claim 6 wherein said plurality of recesses (72, 74, 76) have a depth which is substantially less than the thickness of said block (70) of heat coductive material.

8. The amplifier as defined by claim 1 wherein said active circuit means of said voltage regulator means (26) is implemented in an integrated circuit located in one of said package means (77).

9. The amplifier as defined by claim 1 wherein said first signal amplifier (22) of said electrical signal amplifier means comprises a transistor amplifier.

10. The amplifier as defined by claim 9 wherein said transistor amplifier (22) is implemented by a single transistor located in one of said package means (73).

11. The amplifier as defined by claim 1 wherein said second signal amplifier (24) of said electrical signal amplifier means comprises an operational amplifier.

12. The amplifier as defined by claim 11 wherein the active means of said operational amplifier (24) is implemented in an integrated circuit located in one of said package means (75).

13. The amplifier as defined by claim 1 wherein said gain producing circuit (22) includes a transistor and wherein said unity gain isolation circuit (24) comprises an operational amplifier.

14. The amplifier as defined by claim 13 and said at least one feedback circuit element (66) comprises a resistor coupled from the output of said operational amplifier (24) to the input of said gain producing circuit (22) including the transistor.

15. The amplifier as defined by claim 14 and additionally including at least one other feedback circuit element, said other feedback circuit element comprising a capacitor (68) coupled from the output of said gain producing circuit (22) to the input of said gain producing circuit, said resistor (66) and capacitor (68) acting in combination to determine the signal gain of said gain producing circuit.

16. A low noise, wideband radio frequency signal amplifier, comprising:
reactive input means (30, 32) having an input terminal (28) connectable to a source of electrical power, for filtering said electrical power;
regulating means (36, 38, 40, 42) including a first active element (26) encased in a first thermally conductive package (77), connected to said reactive input means for providing a regulated voltage;
means (54, 56) including a second active element (22) encased in a second thermally conductive package (73), having a signal output node maintained at a potential determined by said regulated voltage and a signal input node, for amplifying a signal applied to said signal input node;
buffer means including a third active element (24) encased in a third thermally conductive package (75) and powered by said regulated voltage, having an input port connected to said output node, and an output port for providing electrical isolation between said output node and said output port;
a heat sink (70) having a substantial mass in comparison to the mass of said active devices and a plurality of receptacles (72, 74, 76) in which said thermally conductive packages are embedded, whereby said heat sink provides a common thermal contact between said thermally conductive packages;
resistive feedback means (66) coupling said output port with said input node and reactive feedback means (68) coupling said output node with said input node, whereby gain in the amplitude of said signal between said input node and said output port is determined by the values of the impedances provided by said resistive and reactive feedback means between said input node and said output port and output node.

* * * * *